June 19, 1962 R. L. HORTON 3,040,185
PULSE FREQUENCY DIVIDER USING SYNCHRONIZED MONOSTABLE
MULTI-TRIGGERING TIMING CIRCUIT IN
SYNCHRONIZED BLOCKING OSCILLATOR
Filed June 27, 1960 3 Sheets-Sheet 1
FIG. I.
PRIOR ART
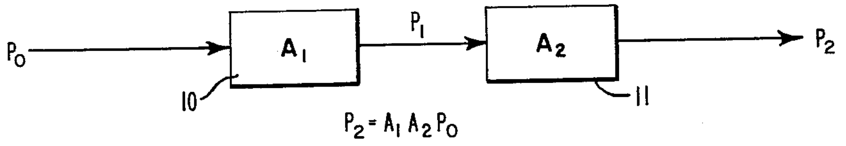
FIG. 2.
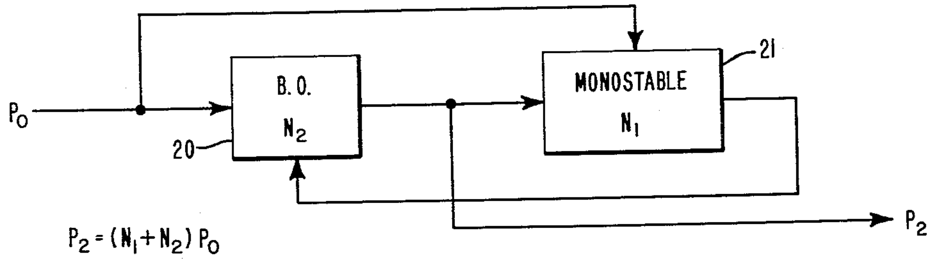
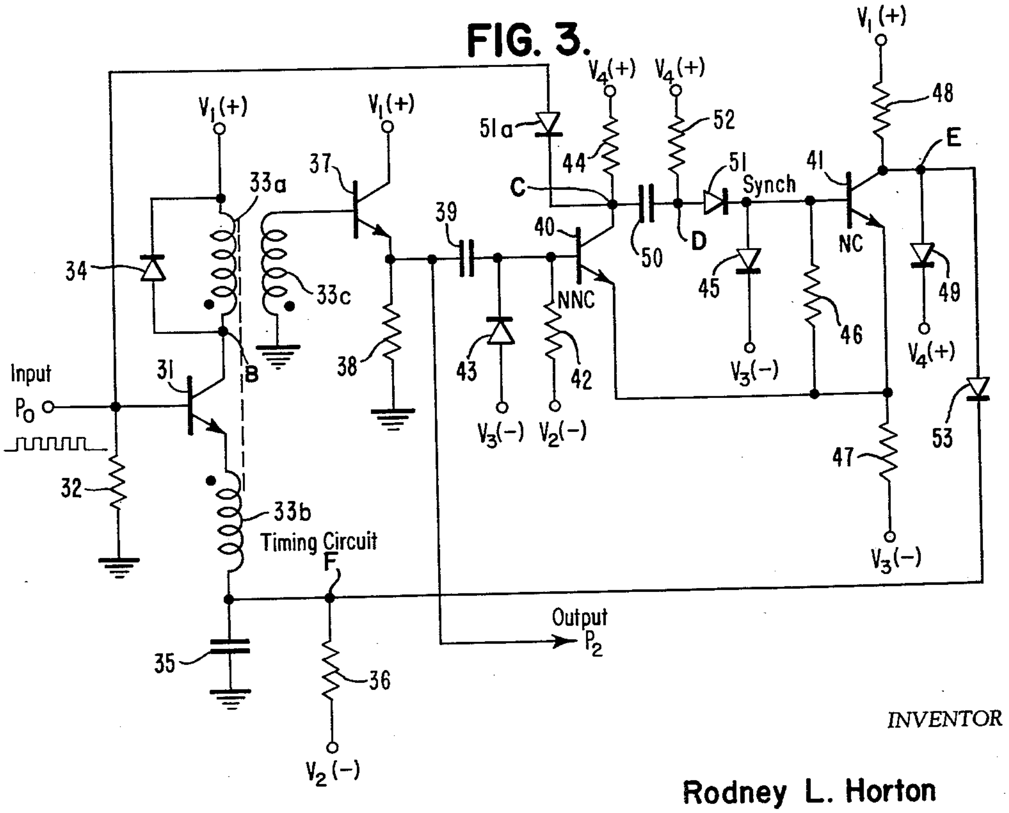
FIG. 3.
INVENTOR
Rodney L. Horton
BY Sughrue, Rothwell, Mion & Zinn
ATTORNEYS June 19, 1962 R. L. HORTON 3,040,185

PULSE FREQUENCY DIVIDER USING SYNCHRONIZED MONOSTABLE MULTI-TRIGGERING TIMING CIRCUIT IN SYNCHRONIZED BLOCKING OSCILLATOR

Filed June 27, 1960 3 Sheets-Sheet 2

June 19, 1962 R. L. HORTON 3,040,185

PULSE FREQUENCY DIVIDER USING SYNCHRONIZED MONOSTABLE MULTI-TRIGGERING TIMING CIRCUIT IN SYNCHRONIZED BLOCKING OSCILLATOR

Filed June 27, 1960 3 Sheets-Sheet 3

United States Patent Office 3,040,185

Patented June 19, 1962

3,040,185

PULSE FREQUENCY DIVIDER USING SYNCHRONIZED MONOSTABLE MULTI-TRIGGERING TIMING CIRCUIT IN SYNCHRONIZED BLOCKING OSCILLATOR

Rodney L. Horton, Langhorn, Pa., assignor to International Business Machines Corporation, New York, N.Y., a corporation of New York Filed June 27, 1960, Ser. No. 39,099
7 Claims. (Cl. 307—88.5)

This invention relates to divider circuits and more particularly to a composite pulse divider circuit.

Conventional pulse frequency divider chains of the prior art utilize a series connection of divider circuits each of which produces a pulse chain output having a number of pulses which is a sub-multiple of the number of pulses fed to the input of the circuit. The time period of the pulses at the output of the divider chain is the product of the dividing ratios of the individual circuits. While such counting chains are quite acceptable when used with vacuum tube circuitry, the use of transistor circuitry requires a different concept for pulse frequency divider circuit design. The low voltage levels and the wide variation of element parameters associated with transistor circuitry make prior art pulse dividing chains unacceptable from the standpoint of accuracy and speed.

Another disadvantage of the prior art pulse dividing chains is that they cannot produce all of the desired dividing ratios. While feedback loops have been employed in conjunction with series type counting chains to obtain different counting ratios, still, all counting ratios are not available by using this technique. It would be advantageous to provide a pulse dividing circuit which can produce any desired dividing ratio by slight modifications in the circuit parameters.

Accordingly, it is an object of this invention to provide an improved pulse dividing circuit having wide operating tolerances.

It is a further object of the present invention to provide an improved pulse dividing circuit which produces dividing ratios not previously obtainable with prior art circuits.

These and other objects and advantages of this invention will become more apparent from the following description and appended claims taken in conjunction with the drawings in which:

FIG. 1 is a block diagram of prior art pulse dividing chains;

FIG. 2 is a block diagram of the pulse dividing circuit of this invention;

FIG. 3 is a circuit diagram of one embodiment of the pulse dividing circuit of this invention;

Figure 4:
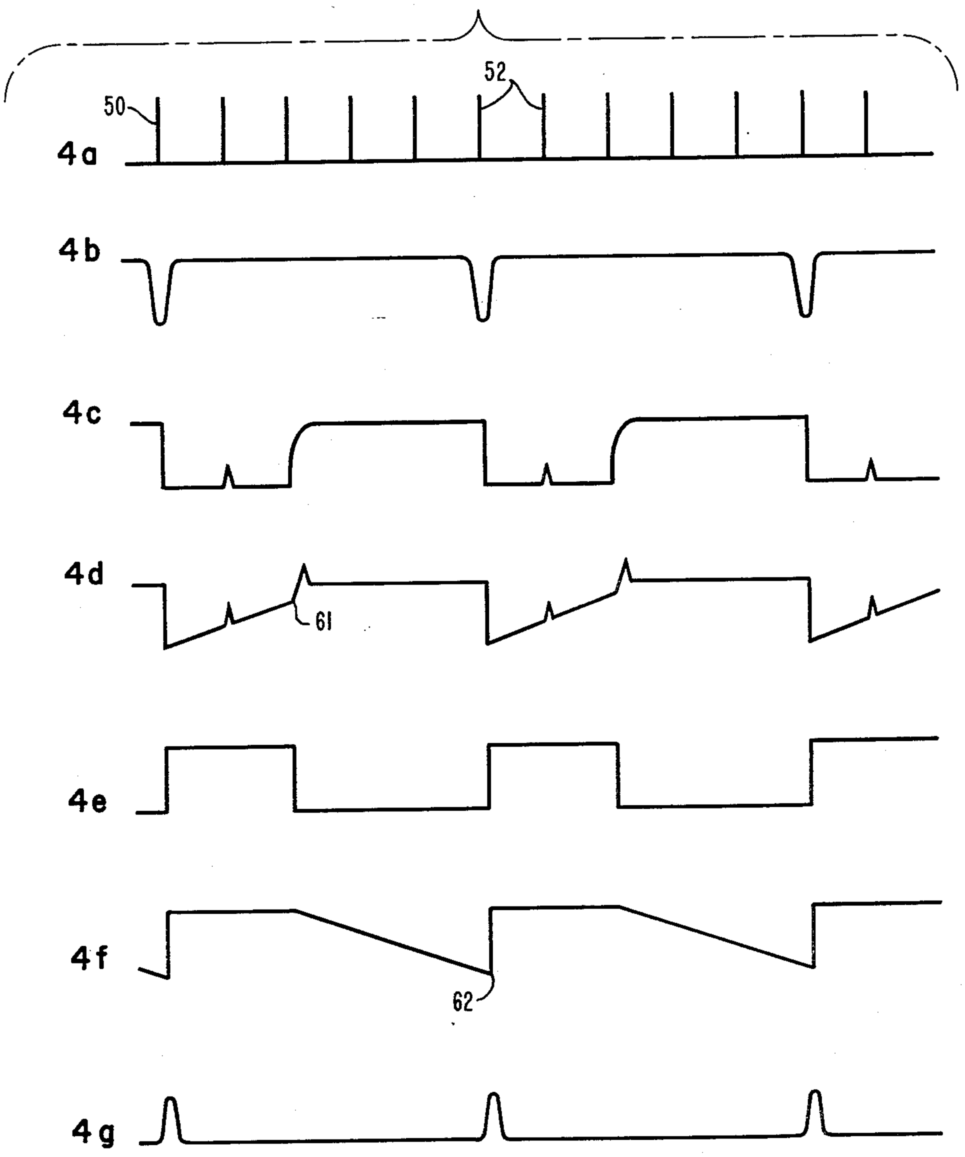
FIG. 4 shows wave forms depicting the operation of the pulse dividing circuit of this invention.

In accordance with one embodiment of the invention, the input pulse train which is to be divided down to produce a pulse train having a frequency which is a submultiple of the frequency of the input pulse train is fed to a blocking oscillator which is fired by the first pulse in the train. The blocking oscillator in turn triggers a monostable multivibrator to its unstable state. There is feedback from the monostable multivibrator back to the blocking oscillator so that the blocking oscillator is disabled when the monostable multivibrator is in its unstable state. After a time, dependent upon the circuit parameters of the monostable multivibrator, the monostable multivibrator is enabled to return to its stable state. The input pulses are connected directly to the monostable multivibrator so that when the monostable multivibrator returns to its stable state this switching is synchronized with one of the input pulses. The return of the multivibrator to its stable state conditions a timing circuit in the blocking oscillator. This timing circuit, a resistor capacitor combination, then charges toward a voltage at which the blocking oscillator is again enabled to fire. When the charge on the capacitor reaches this voltage the next input trigger pulse fires the blocking oscillator again. Each time that the blocking oscillator fires, an output pulse is produced. However, such an output pulse is produced only upon the occurrence of a number of input pulses which is dependent upon the time period that the monostable multivibrator remains in its unstable state and upon the time period that the timing circuit requires to charge to a level at which the blocking oscillator may be re-fired.

Referring to FIG. 1 there is shown an example of a prior art counting chain. This is a series connection of circuits each of which divides the number of input pulses by a particular multiple. The counting circuit 10 has a counting ratio $A_1$ so that it produces $P_1$ output pulses for the $P_0$ input pulses applied to its input. Similarly a counting circuit 11 has a counting ratio $A_2$ so that it produces $P_2$ output pulses for every $P_1$ input pulse applied to the input. The counting ratio of the circuit as a whole is the product of the dividing ratios of the individual circuits 10 and 11. That is, the frequency of the output pulse train $P_2$ equals $A_1A_2P_0$. Counting chains using this concept of counting are not particularly adaptable to transistor circuitry and cannot produce all of the desired counting ratios. The prior art counting chain of FIG. 1 is contrasted with the counting chain of this invention, a block diagram of which is shown in FIG. 2.

Referring to FIG. 2 the input pulse train $P_0$ is applied to a blocking oscillator 20 which is fired by the first pulse in the pulse train. The blocking oscillator in turn triggers a monostable multivibrator 21 to its unstable state. The monostable multivibrator remains in its unstable state for a period of time dependent upon the circuit parameters of the multivibrator. The input pulses $P_0$ are connected directly to the monostable multivibrator 21 so that when it is conditioned to return to its stable state the input pulses will synchronize the switching so that monostable multivibrator will return to its stable state upon the occurrence of an input pulse.

The monostable multivibrator conditions the timing circuit in the blocking oscillator. When the monostable multivibrator is in its unstable state the blocking oscillator is disabled so that further input pulses will not trigger the blocking oscillator. The timing circuit in the blocking oscillator to which the monostable multivibrator is applied has a characteristic such that when the monostable multivibrator returns to its stable state the timing circuit will enable the blocking oscillator after a given period of time. When this period of time elapses the blocking oscillator is then conditioned for firing and the next input pulse again fires the blocking oscillator. The output of the blocking oscillator produces the output pulse train. An output pulse will be produced for a number of input pulses, which member is dependent upon the time period during which the monostable multivibrator remains in its unstable state and the time period required for the timing circuit in the blocking oscillator to condition the blocking oscillator after the timing circuit is enabled. If the monostable multivibrator has a timing characteristic such that it remains in its unstable state for a period of time equal to $n_1$ input pulses and the timing circuit in the blocking oscillator has a characteristic such that it conditions the blocking oscillator a period of time equal to $n_2$ input pulses after the timing circuit is conditioned, then the dividing ratio of the circuit is given by $P_2=(n_1+n_2)P_0$. A configuration for performing pulse frequency division in accordance with the broad concepts described is shown in FIG. 3.

Referring to FIG. 3, the input pulses, $P_0$ are connected to the base of transistor 31 which, with associated circuitry, forms a blocking oscillator. The base of transistor 31 is also returned to ground through a resistor 32.

A regenerative transformer 33 having windings 33*a*, 33*b* and 33*c* provides regeneration for the blocking oscillator. Winding 33*a* is connected in the collector circuit of transistor 31 and is returned to a source of collector voltage $V_1(+)$. Winding 33*a* is shunted by a diode 34 which damps out excessive ringing of the transformer when the blocking oscillator is fired.

A winding 33*b* of the transformer is connected in the emitter circuit of transistor 31 and is connected to a timing network made up of capacitor 35 and resistor 36. The capacitor 35 is charged to a positive voltage when the monostable multivibrator is in its unstable state. During this time the capacitor 35 holds the blocking oscillator transistor 31 in the non-conducting condition. However, after the monostable multivibrator returns to its stable state the positive voltage on capacitor 35 is dissipated until the voltage reaches the point at which the blocking oscillator transistor 31 can conduct, at which time the blocking oscillator fires.

A winding 33*c* of the transformer 33 provides an output from the blocking oscillator. This winding is connected to the base of a transistor connected in an emitter follower configuration. The emitter is connected to an output resistor 38 across which the output pulses $P_2$, are taken.

The output pulses are also coupled through a capacitor 39 to the base of transistor 40, which, together with transistor 41 and associated circuitry makes up the monostable multivibrator. The base of transistor 40 is clamped between two reference voltages, $V_2(-)$ and $V_3(-)$, by resistor 42 and diode 43. This biases transistor 40 normally in the nonconductive condition. The collector of transistor 40 is returned to a source of collector potential $V_4(+)$ through resistor 44. Transistor 41 is biased in the normally conducting state by a voltage $V_3(-)$ which is applied to the base of transistor 41 through a diode 45. The base of transistor 41 is also returned to its emitter through resistor 46. $V_3(-)$ provides emitter potential for transistor 40 and 41 through a resistor 47. The collector of transistor 41 is returned to a source of collector voltage $V_1(+)$ through resistor 48. The collector of transistor 41 is also clamped at $V_4(+)$ by diode 49.

When the blocking oscillator produces a pulse output, the pulse is coupled through the capacitor 39 to the base of transistor 40 and turns transistor 40 on. In order to couple the transistor 40 to the transistor 41, a timing capacitor 50 is provided. The collector of transistor 40 is coupled through capacitor 50 and an isolation diode 51 to the base of transistor 41. Transistor 41 is turned off when transistor 40 is turned on. The time period that the transistor 41 remains off is determined by the period of time required for the charge on capacitor 50 to leak off through a timing resistor 52 to the source of timing potential $V_4(+)$. When the charge on the capacitor 50 has leaked off to a sufficient extent the transistor 41 returns to the conducting state thus returning the monostable multivibrator to its stable state. Input pulses $P_0$ are connected to the monostable multivibrator through a diode 51*a* to synchronize the return of the monostable multivibrator to its stable state with the input pulses.

The monostable multivibrator is connected back to the timing circuit in the blocking oscillator through diode 53. When the monostable multivibrator is in its unstable state a positive voltage will be passed through diode 53 to the capacitor 35. This voltage disables the blocking oscillator from firing. However, when the monostable multivibrator returns to its stable state the collector of transistor 41 returns to a more negative condition. Therefore, the capacitor 35 discharges through resistor 36 and when the voltage on capacitor 35 reaches a sufficiently negative level the transistor 31 may again be fired by the next input pulse.

The operation of the circuit of FIG. 3 can best be described with reference to the wave forms of FIG. 4. FIG. 4*a* shows the input pulses which are applied to the base of transistor 31 in the blocking oscillator. The first pulse causes the blocking oscillator to fire thus causing a negative pulse to appear at the point B on the collector of transistor 31 as shown in FIG. 4*b*. A pulse of positive polarity is coupled through emitter follower 37 and coupling capacitor 39 to the base of transistor 40 thus causing the monostable multivibrator to be switched to its unstable state. The collector of transistor 40 goes negative as the transistor 40 conducts as shown in FIG. 4*c*. This negative going voltage is coupled through the capacitor 50 to the base of transistor 41 thus causing transistor 41 to cut off. The collector of transistor 41 goes positive as shown in FIG. 4*e* and this positive going voltage is coupled through diode 53 back to the emitter of transistor 31 in the blocking oscillator circuit. This positive voltage disables the blocking oscillator thus preventing it from firing upon subsequent input pulses.

As the charge on capacitor 50 in the monostable multivibrator starts to bleed off as shown in FIG. 4*d* the potential at point D becomes more positive until the point 61 is reached at which time transistor 41 again becomes conducting and the monostable multivibrator returns to its stable state. The collector of transistor 41 returns to a negative value as shown in FIG. 4*e*. This voltage, applied to the capacitor 35 in the timing network of the blocking oscillator allows the capacitor 35 to discharge toward a negative value. As this charge on capacitor 35 leaks off the point 62 is reached, as shown in FIG. 4*f*, at which point the blocking oscillator is again enabled and the next positive pulse fires the blocking oscillator and induces another output.

Thus, an output pulse, shown in FIG. 4*g*, has been produced for every five input pulses. That is, the frequency divider circuit shown has a pulse dividing ratio of 5. However, this pulse dividing ratio can be changed to any desired ratio very simply by changing the characteristics of the timing resistor 52 in the multivibrator circuit thus changing the time period that the monostable multivibrator remains in its unstable state or by changing the values of capacitor 35 or resistor 36 in the timing network so that the time period between the monostable multivibrators' being returned to its stable state and the firing of the blocking oscillator is changed.

Figure 5:
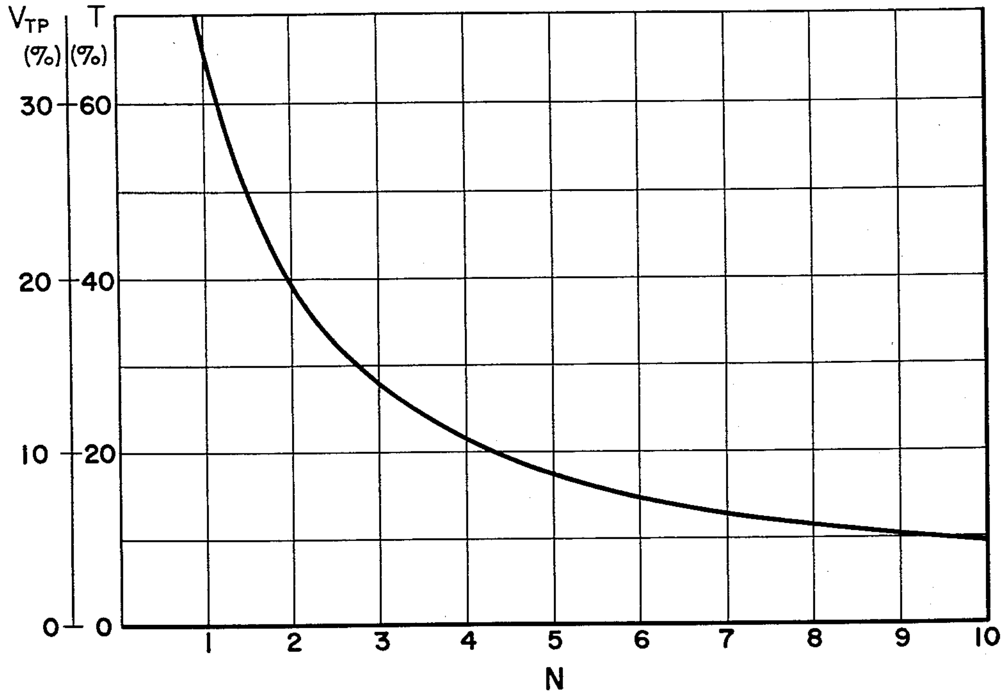
FIG. 5 shows the permissible variation of synchronizing pulse amplitude and of network time constant for the divider of this invention.

The permissible variation of synchronizing pulse amplitude, $V_{TP}$, and of timing network time constant, T, for various dividing ratios, N, is shown in FIG. 5. FIG. 5 shows that the frequency divider of the subject invention will operate under wider variations of pulse amplitude and timing network time constant than prior art frequency dividers. As an example, a composite pulse frequency divider constructed in accordance with the subject invention having a dividing ratio of five has a permissible $V_{TP}$ variation of plus or minus 9.2% and a permissible T variation of plus or minus 18.4%.

The percentages shown in FIG. 5 have significance only when viewed in relation to the order of magnitude of the $V_{TP}$ and T being considered. For a specific timing voltage $V_{timing}$ applied to a timing network the following relationship holds:

$$\frac{V_{timing}}{N} > V_{TP} > \frac{V_{timing}}{N}$$

A practical value of $V_{timing}$ would be 5 volts giving a $V_{TP}$ maximum of one volt when $N=5$. Thus the permissible variation of $V_{TP}$ is plus or minus 80 millivolts. This is the same order of magnitude as the change in firing potential from transistor-to-transistor at room temperature and is equal to the change in base-to-emitter drop in a silicon transistor over a 90° C. temperature change.

In regard to the time constant T of the timing network in the blocking oscillator circuit it should be noted that the resistive portion of the time constant is in parallel with the back biased base-emitter junction of transistor 31. Therefore, variations in the resistance of the back biased base-emitter junction, caused by temperature variations, change the value of the effective timing resistance. An important feature of the frequency divider of this invention is that the one-shot multivibrator can add charge to the timing network of the blocking oscillator, clamping it at a value of $V_{timing}$ much larger than obtainable with a simple blocking oscillator with similar rise time and power consumption. This permits larger variations of $V_{TP}$ and smaller values of the resistance in the timing network, both of which reduce the amount that the physical circuit degrades the idealized tolerance.

While a specific embodiment has been shown and described, it will, of course, be understood that various other modifications may be made. The appended claims are therefore to cover any such modifications within the true spirit and scope of the invention.

What I claim as new and desire to secure by Letters Patent of the United States is:

1. A pulse frequency divider producing an output pulse train having a first pulse period from an input pulse train having a second pulse period comprising a blocking oscillator, said input pulse train being connected to the input of said blocking oscillator, said blocking oscillator having an unstable period equal to a first constant times the second pulse period, a monostable trigger circuit, said monostable trigger circuit having an unstable period equal to a second constant times the second pulse period, the output of said blocking oscillator being connected to said monostable trigger circuit to trigger said monostable circuit to its unstable state, said input pulse train being connected to said monostable trigger circuit to synchronize the switching of said trigger circuit to its stable state, said monostable trigger circuit being connected to disable said blocking oscillator when said monostable trigger circuit is in its unstable state, said output pulse train being taken from the output of said blocking oscillator, said output pulse train having a pulse period equal to the sum of said first and second constants times the second pulse period.

2. A pulse frequency divider producing an output pulse train having a pulse period of $P_2$ from an input pulse train having a pulse period of $P_0$ wherein $P_2$ and $P_0$ are integers denoting units of time, said divider comprising a blocking oscillator, said input pulse train being connected to the input of said blocking oscillator, said blocking oscillator having an unstable period equal to $N_2P_0$, a monostable trigger circuit, said monostable trigger circuit having an unstable period equal to $N_1P_0$, $N_1$ and $N_2$ being integers, the output of said blocking oscillator being connected to said monostable trigger circuit to trigger said monostable trigger circuit to its unstable state, said input pulse train being connected to said monostable trigger circuit to synchronize the switching of said monostable trigger circuit to its stable state, said monostable trigger circuit being connected to disable said blocking oscillator when said monostable trigger circuit is in its unstable state, said output pulse train being taken from the output of said blocking oscillator, said output pulse train having a pulse period equal to $(N_1+N_2)P_0$.

3. A pulse frequency divider producing an output pulse train having a first pulse period from an input pulse train having a second pulse period comprising a blocking oscillator including a timing circuit for disabling said blocking oscillator for a period of time after the timing circuit is energized, said period of time being dependent upon the circuit parameters of said timing circuit, said input pulse train being connected to said blocking oscillator so that an input pulse fires said blocking oscillator, a monostable trigger circuit, the output of said blocking oscillator being connected to said monostable trigger circuit to trigger said monostable trigger circuit to its unstable state, said input pulse train being connected to said monostable trigger circuit to synchronize the switching of said monostable trigger circuit to its stable state, the output of said monostable trigger circuit being connected to said timing circuit so that said timing circuit is energized when said monostable trigger circuit returns to its stable state.

4. A pulse frequency divider producing an output pulse train having a pulse period of $P_2$ from an input pulse train having a pulse period of $P_0$ wherein $P_2$ and $P_0$ are integers denoting units of time, said divider comprising a blocking oscillator, said blocking oscillator having an unstable period equal to $N_2P_0$, said input pulse train being connected to the input of said blocking oscillator, said blocking oscillator including a timing circuit for enabling said blocking oscillator a period of time after said timing circuit is energized, said period of time being dependent upon the circuit parameters of said timing circuit, a monostable trigger circuit, said monostable trigger circuit having an unstable period equal to $N_1P_0$, $N_1$ and $N_2$ being integers, the output of said blocking oscillator being connected to said monostable trigger circuit whereby said monostable trigger circuit is switched to its unstable state when said blocking oscillator is fired, said input pulse train being connected to said monostable trigger circuit to synchronize the switching of said monostable trigger circuit to its stable state, the output of said monostable trigger circuit being connected to said timing circuit, said timing circuit being energized when said monostable multivibrator is switched to its stable state, said output pulse train being taken from the output of said blocking oscillator, said output pulse train having a pulse period equal to $(N_1+N_2)P_0$.

5. A pulse frequency divider producing an output pulse train having a first pulse period from an input pulse train having a second pulse period comprising a blocking oscillator including a first transistor, said input pulse train being connected to the base of said transistor, a regenerative transformer having three windings, one winding of said transformer being connected in the emitter circuit of said transistor circuit, a second winding of said transformer being connected in the collector circuit of said transistor whereby said first transistor is regeneratively turned on upon the occurrence of an input pulse, a third winding of said transformer being connected to provide an output from said blocking oscillator, a timing circuit including a timing capacitor and a timing resistor, said timing capacitor being connected to the emitter of said first transistor so that said blocking oscillator is disabled when said timing capacitor is charged to a first voltage, said timing capacitor being discharged through said timing resistance so that said blocking oscillator is enabled a period of time after a second voltage is applied to said timing capacitor, a monostable trigger circuit, the output of said blocking oscillator being connected to said monostable trigger circuit to trigger said monostable trigger circuit to its unstable state, said input pulse train being connected to said monostable trigger circuit to synchronize the switching of said monostable trigger circuit to its stable state, the output of said monostable trigger circuit being connected to said timing capacitor whereby said first voltage is applied to said timing capacitor when said monostable trigger circuit is in its unstable state and said second voltage is applied to said timing capacitor when said monostable trigger circuit is in its stable state.

6. A pulse frequency divider producing an output pulse train having a first pulse period from an input pulse train having a second pulse period comprising a blocking oscillator, said input pulse train being connected to the input of said blocking oscillator, said blocking oscillator having an unstable time period, a monostable trigger circuit including first and second transistors, said first transistor being normally biased in the non-conducting state, said second transistor being normally biased in the conducting state, the output of said blocking oscillator being coupled to the base of said first transistor so that said first transistor is turned on upon the occurrence of an output pulse, a timing capacitor, the collector of said first transistor being coupled to the base of said second transistor through said timing capacitor, said second transistor being turned off when said first transistor is turned on, a timing resistor connected to said timing capacitor, said timing capacitor being discharged through said timing resistor, said second transistor being turned on a period of time after said second transistor is turned off, said period of time being dependent on the characteristics of said timing resistor and said timing capacitor, said input pulse train being connected to the collector of said first transistor to synchronize the switching of said second transistor to the conducting state, the collector of said second transistor being connected to said blocking oscillator so that said blocking oscillator is enabled a time period equal to the blocking oscillator unstable time period after said second transistor returns to its conducting state.

7. A pulse frequency divider producing an output pulse train having a pulse period of $P_2$ from an input pulse train having a pulse period of $P_0$ wherein $P_0$ and $P_2$ are integers denoting units of time said divider comprising a blocking oscillator including a first transistor, said input pulse train being connected to the base of said first transistor, a regenerative transformer having three windings, one winding of said transformer being connected in the emitter circuit of said transistor, a second winding of said transformer being connected in the collector circuit of said transistor whereby said first transistor is regeneratively turned on upon the occurrence of an input pulse, a second transistor connected in an emitter follower configuration, said third winding of said transformer being connected to the base of said second transistor so that the emitter of said second transistor produces an output pulse when said first transistor is regeneratively turned on, a monostable trigger circuit including third and fourth transistors, said third transistor being normally biased in the non-conducting state, said fourth transistor being normally biased in the conducting state, the emitter of said second transistor being coupled to the base of said third transistor so that said third transistor is turned on upon the occurrence of an output pulse, a timing capacitor, the collector of said third transistor being coupled to the base of said fourth transistor through said timing capacitor so that said fourth transistor is turned off when said third transistor is turned on, a timing resistor connected to said timing capacitor, said timing capacitor being discharged through said timing resistor, said fourth transistor being turned on a period of time after being turned off, said period of time being dependent on the characteristics of said timing resistor and said timing capacitor, and a timing circuit including a second timing capacitor and a second timing resistor, said second timing capacitor being connected to the emitter of said first transistor, the collector of said fourth transistor being connected to said timing capacitor whereby said timing capacitor is charged to a voltage which disables said blocking oscillator when said monostable trigger circuit is in its unstable state and said timing capacitor is discharged toward a voltage at which said blocking oscillator is enabled when said monostable trigger circuit returns to its stable state.

References Cited in the file of this patent

UNITED STATES PATENTS

| | | |
|---|---|---|
| 2,585,722 | Baird | Feb. 12, 1952 |
| 2,863,053 | Downes | Dec. 2, 1958 |